(12) United States Patent
Park

(10) Patent No.: US 10,784,113 B2
(45) Date of Patent: Sep. 22, 2020

(54) CHEMICAL MECHANICAL POLISHING APPARATUS

(71) Applicant: KCTECH CO., LTD., Anseong-si (KR)

(72) Inventor: Kyunam Park, Anseong-si (KR)

(73) Assignee: KCTECH CO., LTD., Anseong-si (KR)

( * ) Notice: Subject to any disclaimer, the term of this patent is extended or adjusted under 35 U.S.C. 154(b) by 0 days.

(21) Appl. No.: 15/773,904

(22) PCT Filed: Aug. 8, 2016

(86) PCT No.: PCT/KR2016/008674
§ 371 (c)(1),
(2) Date: May 4, 2018

(87) PCT Pub. No.: WO2017/115968
PCT Pub. Date: Jul. 6, 2017

(65) Prior Publication Data
US 2018/0330956 A1    Nov. 15, 2018

(30) Foreign Application Priority Data

Dec. 30, 2015  (KR) .......................... 10-2015-0189637

(51) Int. Cl.
*H01L 21/304* (2006.01)
*H01L 21/306* (2006.01)
(Continued)

(52) U.S. Cl.
CPC .............. *H01L 21/304* (2013.01); *C09G 1/02* (2013.01); *H01L 21/02002* (2013.01);
(Continued)

(58) Field of Classification Search
None
See application file for complete search history.

(56) References Cited

U.S. PATENT DOCUMENTS 7,086,929 B2 *  8/2006  Wiswesser ............ B24B 37/013
                                              257/E21.23
7,101,254 B2 *  9/2006  Swedek ................ B24B 37/005
                                              451/286
(Continued)

FOREIGN PATENT DOCUMENTS

JP    2000-263433 A    9/2000
JP    2001-353659 A   12/2001
(Continued)

OTHER PUBLICATIONS

PCT Written Opinion of the International Search Authority. dated Nov. 21, 2016.*
(Continued)

*Primary Examiner* — Sylvia MacArthur
(74) *Attorney, Agent, or Firm* — Stein IP, LLC

(57) ABSTRACT

Provided are a chemical mechanical polishing apparatus and a control method thereof. The chemical mechanical polishing apparatus includes a plurality of polishing platens provided with a polishing pad on an upper surface thereof, and a polishing platen transferring unit for transferring the plurality of polishing platens to different process positions according to a predetermined process sequence. Here, different processes are performed at different process positions.

9 Claims, 13 Drawing Sheets

(51) Int. Cl.
*H01L 21/67* (2006.01)
*H01L 21/02* (2006.01)
*C09G 1/02* (2006.01)
*B24B 37/12* (2012.01)
*B24B 37/20* (2012.01)

(52) U.S. Cl.
CPC .. *H01L 21/30625* (2013.01); *H01L 21/67092* (2013.01); *B24B 37/12* (2013.01); *B24B 37/20* (2013.01)

(56) References Cited

U.S. PATENT DOCUMENTS

| | | | | |
|---|---|---|---|---|
| 7,232,363 | B2* | 6/2007 | Zhang | B24B 37/04 |
| | | | | 451/41 |
| 7,559,823 | B2* | 7/2009 | Sato | B24B 37/345 |
| | | | | 451/11 |
| 8,851,959 | B2* | 10/2014 | Jiang | B24B 57/02 |
| | | | | 451/280 |
| 10,096,482 | B2* | 10/2018 | Hui | B24B 37/005 |
| 2007/0123047 | A1* | 5/2007 | Shirasu | B24B 37/30 |
| | | | | 438/692 |
| 2010/0003902 | A1* | 1/2010 | Yilmaz | B24B 37/345 |
| | | | | 451/64 |
| 2018/0330956 | A1* | 11/2018 | Park | H01L 21/304 |

FOREIGN PATENT DOCUMENTS

| | | |
|---|---|---|
| JP | 2008-290209 A | 12/2008 |
| KR | 10-2004-0059447 A | 7/2004 |
| KR | 10-2011-0039308 A | 4/2011 |

OTHER PUBLICATIONS

Machine Generated English Translation of claims of JP2000-263433. Published Sep. 26, 2000 (Year: 2000).*
Machine Generated English Translation of specification of JP2000-263433. Published Sep. 26, 2000 (Year: 2000).*
International Search Report dated Nov. 21, 2016, issued to International Application No. PCT/KR2016/008674.
Chinese Office Action dated Jun. 7, 2018, issued to Chinese Application No. 201690001374.8.
Korean Office Action dated Jul. 21, 2016, issued to Korean Application No. 10-2015-0189637.

* cited by examiner

PRIOR ART

PRIOR ART

CHEMICAL MECHANICAL POLISHING APPARATUS

CROSS-REFERENCE TO RELATED APPLICATIONS

This application is a national stage of International Application No. PCT/KR2016/008674, filed Aug. 8, 2016, which claims benefit of priority to Korean Application No. 10-2015-0189637, filed Dec. 30, 2015, in the Korean Intellectual Property Office, the disclosures of which are incorporated herein by reference.

TECHNICAL FIELD

The present invention relates to a chemical mechanical polishing apparatus and a control method thereof, and more particularly, to a chemical mechanical polishing apparatus and a control method thereof capable of performing different processes at different process positions using a plurality of polishing platens.

BACKGROUND ART

As fine circuit lines of high density are integrated in semiconductor devices, precision polishing corresponding thereto is performed on a wafer surface. In order to more precisely perform polishing of a wafer, a Chemical Mechanical Polishing (CMP) process in which chemical polishing as well as mechanical polishing is performed is performed as shown in FIGS. 1 and 2.

That is, a polishing pad 11 which a wafer W is in contact with while being pressed is disposed on the upper surface of a polishing platen 10 so as to rotate (11d) together with the polishing platen 10, and mechanical polishing using friction is performed on the wafer W while supplying slurry through a slurry feeding inlet 30. At this time, a polishing process is performed on the wafer W, which is rotated (20d) at a position by the carrier head 20 to be precisely flattened.

The slurry coated on the surface of the polishing pad 11 is uniformly spread on the polishing pad 11 and is introduced into the wafer W by a conditioner 40 rotating in the direction indicated by 40d while an arm 41 is rotating in the direction indicated by 41d. The polishing pad 11 can maintain a uniform polishing surface by the mechanical dressing process of the conditioner 40.

However, typically, as all of the chemical mechanical polishing process by the carrier head, the process of modifying the surface of the polishing pad by the conditioner, and the cleaning process of the polishing pad are configured to be performed on a single polishing pad, it is difficult to maximize the polishing efficiency of a substrate and to perform a quick and accurate process changeover.

In particular, in order to improve the stability of the polishing uniformity and the polishing rate, the surface of the polishing pad needs to be sufficiently modified under optimum conditions. However, typically, since the chemical mechanical polishing process and the surface modification process of the polishing pad are together performed on one polishing pad, it is difficult to modify the surface of the polishing pad under the optimum conditions.

Also, in the related-art, since each process is performed on one polishing pad, the chemical mechanical polishing process needs to be inevitably stopped during the cleaning process (and/or the modification process) of the polishing pad, thereby causing reduction of productivity and work efficiency. Particularly, when a plurality of wafers are continuously processed, there is a limitation in that a time loss for changing each process of the polishing pad occurs.

For this, various studies for improving the process efficiency and the polishing efficiency are recently being conducted, but are still insufficient and more development is needed.

DISCLOSURE

Technical Problem

The present invention provides a chemical mechanical polishing apparatus and a control method thereof, which can improve process efficiency and polishing efficiency.

The present invention also provides a chemical mechanical polishing apparatus and a control method thereof, which can perform different processes at different process positions using a plurality of polishing platens.

The present invention also provides a chemical mechanical polishing apparatus and a control method thereof, which can improve stability and reliability and can improve productivity, The present invention also provides a chemical mechanical polishing apparatus and a control method thereof, which can optimize the surface modification characteristics of a polishing pad and improve the polishing quality of a substrate.

Technical Solution

According to preferred embodiments of the present invention, there is provided a chemical mechanical polishing apparatus including: a plurality of polishing platens provided with a polishing pad on an upper surface thereof; and a polishing platen transferring unit for transferring to dispose the plurality of polishing platens to different process positions according to a predetermined process sequence, wherein different processes may be performed at different process positions.

For reference, a substrate in the present disclosure may be understood as a polishing subject that can be polished on polishing pads, and the present invention is not limited by the type and characteristics of the substrate. As an example, a wafer may be used as the substrate.

The polishing platen transferring unit may transfer to dispose each polishing platen by defining different process positions in various conditions according to required conditions and design specifications. For example, the polishing platen transferring unit allows the plurality of polishing platens to move to dispose from a predetermined reference process position to at least one peripheral process position, and different processes may be performed on the polish pad at the reference process position and the peripheral process position. Here, the number of peripheral process positions may be variously changed according to required conditions and design conditions.

The types and characteristics of processes performed at the reference process position and the peripheral process positions may be variously changed according to required conditions and design specifications. For example, at the reference process position, a substrate may be in contact with the polishing pad, and a chemical mechanical polishing process may be performed. Also, a surface modification process of the polishing pads may be performed at the first peripheral process position, and a cleaning process for cleaning the surfaces of the polishing pads may be performed at the second peripheral process position. In an embodiment, the modification process and the cleaning process may be together performed at the first peripheral process position, or the modification process and the cleaning process may be together performed at the second peripheral process position. Alternatively, the modification process or the cleaning process may be performed at the reference process position.

Also, a carrier head for pressing a substrate against the polishing pad disposed over the reference process position may be provided at the reference process position. In addition, a conditioner for surface modification of the polishing pad disposed over the first peripheral process position may be provided at the first peripheral process position. Furthermore, a cleaning unit for cleaning the surface of the polishing pad disposed over the second peripheral process position may be provided at the second peripheral process position.

Also, different processes may be performed at the reference process position and the peripheral process positions, respectively. At the reference process position and the peripheral process positions, different processes may be simultaneously performed on each polishing pad. In an embodiment, different processes may be performed with a certain time difference on the polishing pads at the reference process position and the peripheral process position, respectively.

The polishing platen transferring unit may move to dispose the plurality of polishing platens to different process positions in various ways according to required conditions and design specifications. For example, the polishing platen transferring unit may rotate the plurality of polishing platens to different process positions. Here, when the plurality of polishing platens are rotated to different process positions, it may be understood that the plurality of polishing platens circulate to different process positions according to a predetermined process sequence. For example, the plurality of polishing platens may be disposed on the same circumference, and the polishing platen transferring unit may rotate and move the plurality of polishing platens to different process positions.

The polishing platen transferring unit may be provided with various structures capable of rotating the plurality of polishing platens. For example, the polishing platen transferring unit may include a connecting member connected to the plurality of polishing platens, and a driving unit providing a driving force for rotating the connecting member. Also, a sensing unit for sensing the rotational position of the plurality of polishing platens may be provided. According to the sensing result of the sensing unit, the driving unit may be controlled by a controller.

According to another preferred embodiment of the present invention, there is provided a chemical mechanical polishing apparatus including: a plurality of polishing platens provided with a polishing pad on an upper surface thereof; and a polishing platen transferring unit for transferring the plurality of polishing platens to different process positions according to a predetermined process sequence, wherein the polishing platen transferring unit may rotate a plurality of polishing platens to different process positions by moving the plurality of polishing platens in a straight line along a predetermined path. In an embodiment, the polishing platen transferring unit may rotate the plurality of polishing platens to different process positions along a path in which straight lines and curved lines are combined, and the present invention is not limited according to the rotation path.

According to another preferred embodiment of the present invention, there is provided a chemical mechanical polishing apparatus including: a plurality of polishing platens provided with a polishing pad on an upper surface thereof; and a polishing platen transferring unit for transferring the plurality of polishing platens to different process positions according to a predetermined process sequence, wherein the polishing platen transferring unit allows the plurality of polishing platens to reciprocate to different process positions.

According to another preferred embodiment of the present invention, there is provided a method of controlling a chemical mechanical polishing apparatus including a plurality of polishing platens having a polishing pad disposed on an upper surface thereof including: disposing the plurality of polishing platens at different process positions; performing different processes on each polishing pad disposed at the different process positions; and moving the plurality of polishing platens to other process positions according to a predetermined process sequence.

The different process positions of the plurality of polishing platens may be defined in various ways according to the required conditions and design specifications. For example, in the disposing of the plurality of polishing platens, the plurality of polishing platens may be disposed at a predetermined reference process position P1 and at least one peripheral process position.

In the performing of the different processes, different processes may be performed on the polishing pads disposed at different process positions, and the types and characteristics of the processes performed at different process positions are variously changed according to required conditions and design specifications. For example, at the reference process position, a substrate may make contact with the polishing pads and the chemical mechanical polishing process may be performed. Also, the surface modification process of the polishing pads may be performed at the first peripheral process position, and the cleaning process for cleaning the surfaces of the polishing pads may be performed at the second peripheral process position. In an embodiment, the modification process and the cleaning process may be together performed at the first peripheral process position, or the modification process and the cleaning process may be together performed at the second peripheral process position. Alternatively, the modification process or the cleaning process may be performed at the reference process position.

Also, in the performing of the different processes, different processes may be performed at the reference process position and the peripheral process positions, respectively. At the reference process position and the peripheral process positions, different processes may be simultaneously performed on each polishing pad. In an embodiment, different processes may be performed with a certain time difference on the polishing pads at the reference process position and the peripheral process position, respectively.

In the moving of the plurality of polishing platens, the plurality of polishing platens may be moved to different process positions in various ways according to required conditions and design specifications. For example, in the moving of the plurality of polishing platens, the plurality of polishing platens may be moved to different process positions.

Here, when the plurality of polishing platens are rotated to different process positions, it may be understood that the plurality of polishing platens circulate to different process positions according to a predetermined process sequence. For example, the plurality of polishing platens may be disposed on the same circumference, and the polishing platen transferring unit may rotate and move the plurality of polishing platens to different process positions. In another embodiment, in the moving of the plurality of polishing platens, it is possible to straightly move a plurality of polishing platens along a predetermined path to rotate and move the plurality of polishing platens to different process positions. Alternatively, it is also possible to configure the plurality of polishing platens to rotate to different process positions along a combined path of a straight line and a curved line in the moving of the plurality of polishing platens. In another embodiment, in the moving of the plurality of polishing platens, a plurality of polishing platens may be configured to reciprocate to different process positions.

Other features and aspects will be apparent from the following detailed description, the drawings, and the claims.

Advantageous Effects

As described above, according to an embodiment of the present invention, the process efficiency can be improved and the polishing efficiency can be improved.

Particularly, according to an embodiment of the present invention, it is possible to perform different processes at different process positions using a plurality of polishing platens, thereby improving the process efficiency and polishing efficiency.

Also, according to an embodiment of the present invention, since different polishing processes can be performed at different process positions using a plurality of polishing platens, different processes can be simultaneously performed. Accordingly, productivity can be improved, and efficiency deterioration and performance deterioration caused when different processes are performed in a single polishing pad can be prevented.

In addition, according to an embodiment of the present invention, while a chemical mechanical polishing process is being performed on a specific polishing pad, the surface modification process can be sufficiently and stably performed in another polishing pad. Since the chemical mechanical polishing process for another substrate used in the next polishing process can be performed on another polishing pad that is optimally modified, the polishing quality and polishing uniformity of the substrate can be further improved.

Furthermore, according to an embodiment of the present invention, since a chemical mechanical polishing process can be carried out using a different polishing pad without a need to modify and clean a polishing pad after the chemical mechanical polishing process is performed on the specific polishing pad, a time loss due to modification and cleaning of the polishing pad can be prevented, and a chemical mechanical polishing process for a plurality of substrates can be quickly performed.

[Description of Symbols]

| | |
|---|---|
| 100: carrier head | 110: first polishing platen |
| 112: first polishing pad | 120: second polishing platen |
| 122: second polishing pad | 130: third polishing platen |
| 132: third polishing pad | 200: conditioner |
| 300: cleaning unit | 400: polishing platen transferring unit |
| 410: connecting member | 411: unit center |
| 412: first arm | 413: second arm |
| 414: third arm | 420: driving unit |
| 500: sensing unit | 600: controller |
| 700: main shaft | |

Best Mode

Hereinafter, exemplary embodiments of the present invention will be described in detail with reference to the accompanying drawings. However, the present invention is not limited to the embodiments. For reference, the same numbers in this disclosure denote the substantially same elements, and under this rule, may be described with reference to the contents described in the other drawings. The contents which are determined to be obvious to persons skilled in the art or are repeated can be omitted.

Figure 1:
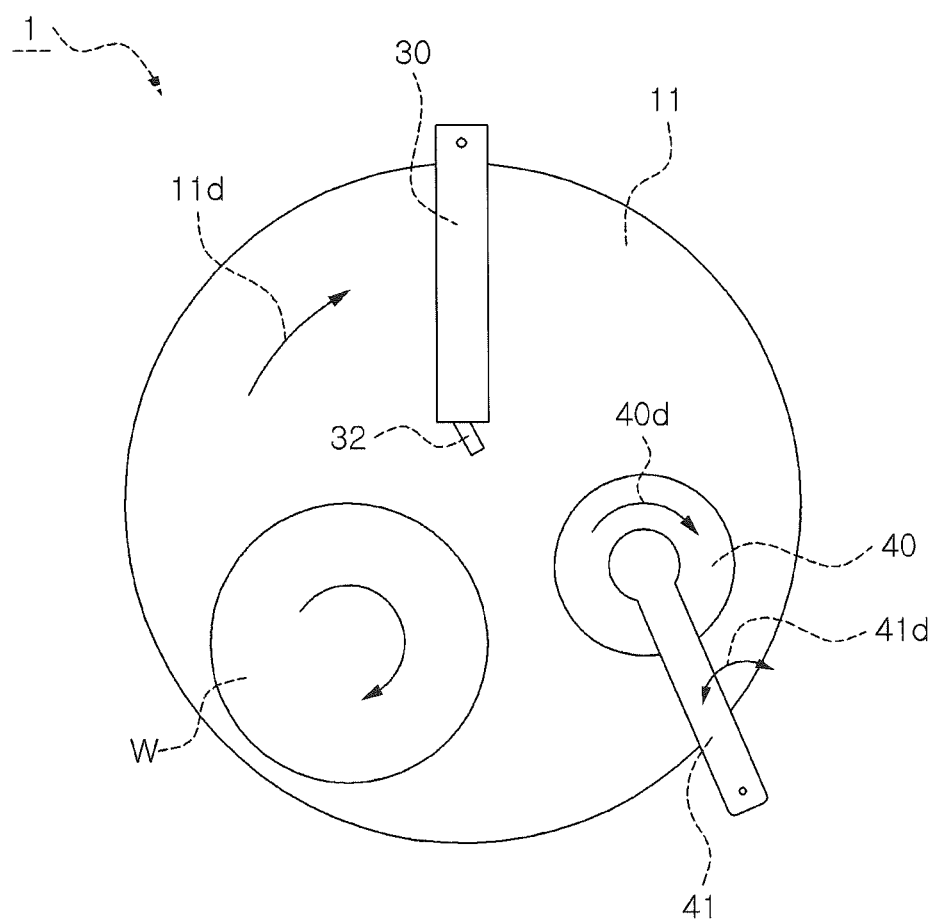
FIGS. 1 and 2 are views illustrating a typical chemical mechanical polishing apparatus.
Figure 2:
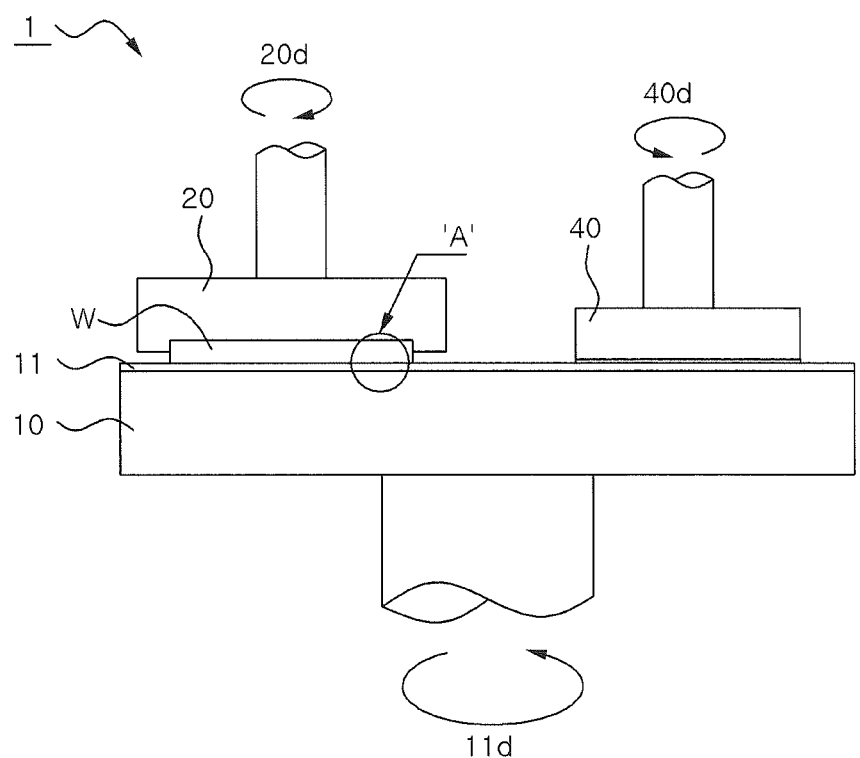
Figure 3:
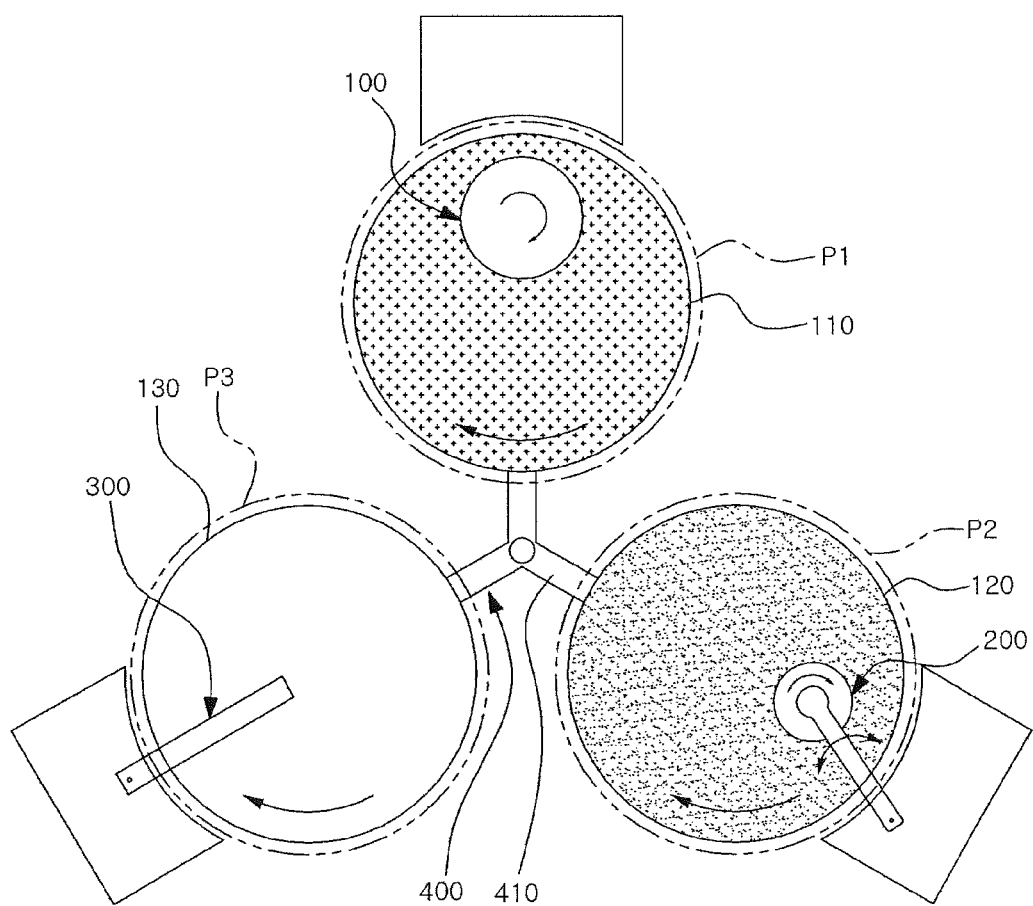
FIGS. 3 and 4 are views illustrating a chemical mechanical polishing apparatus according to an embodiment of the present invention.
Figure 4:
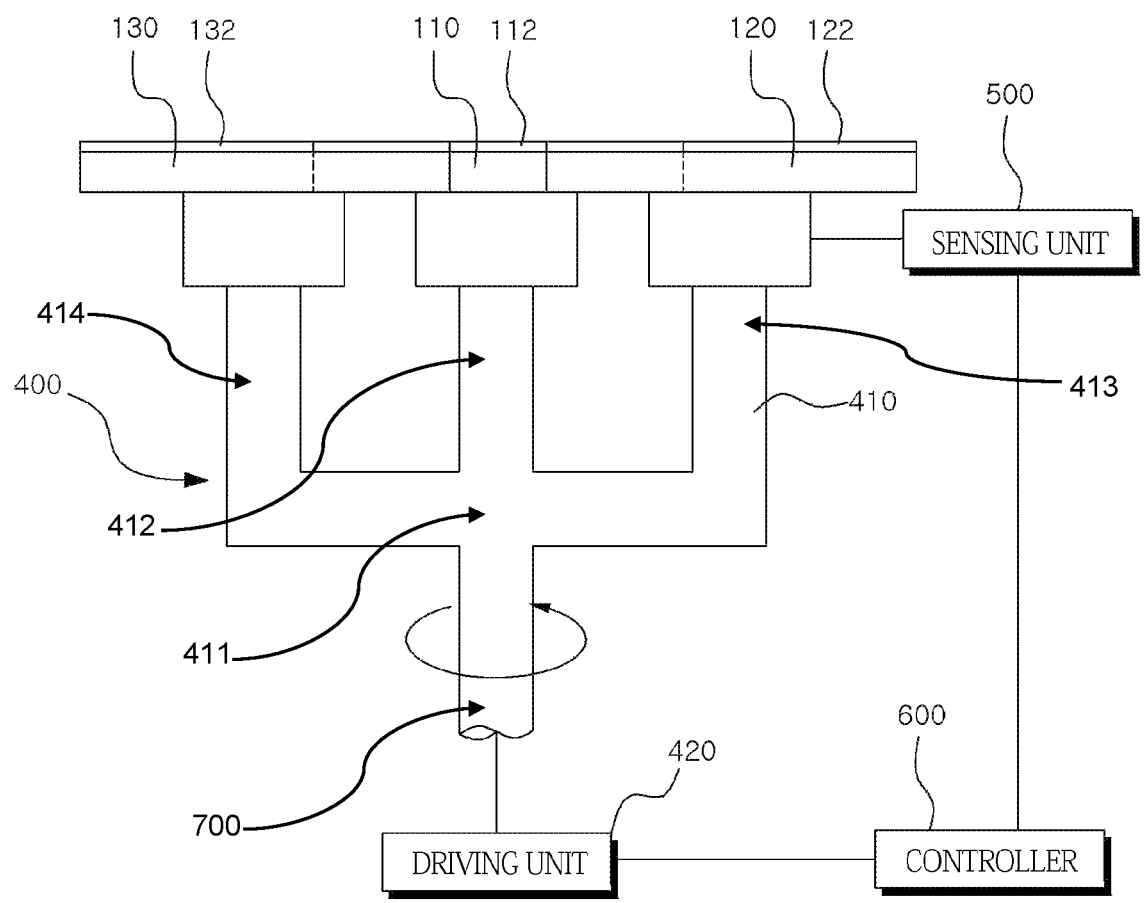
Figure 5:
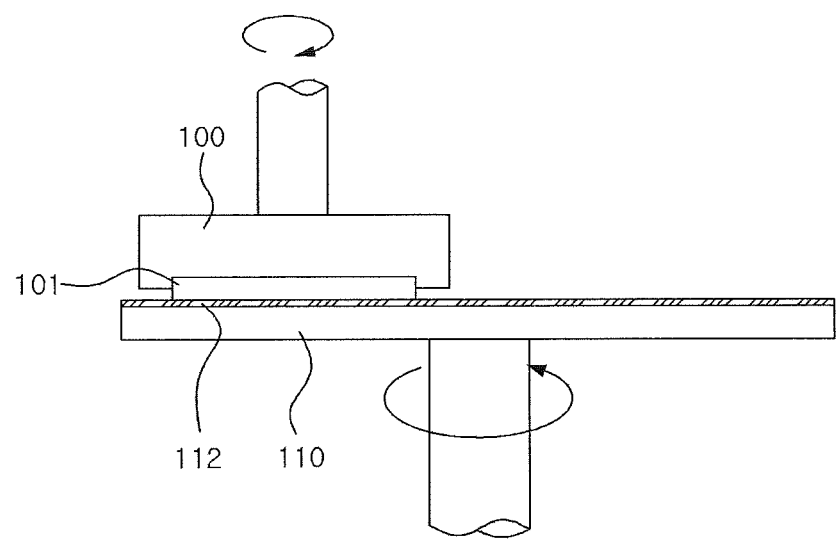
FIG. 5 is a view illustrating a chemical mechanical polishing apparatus according to an embodiment of the present invention, which is a view for explaining a carrier head.
Figure 6:
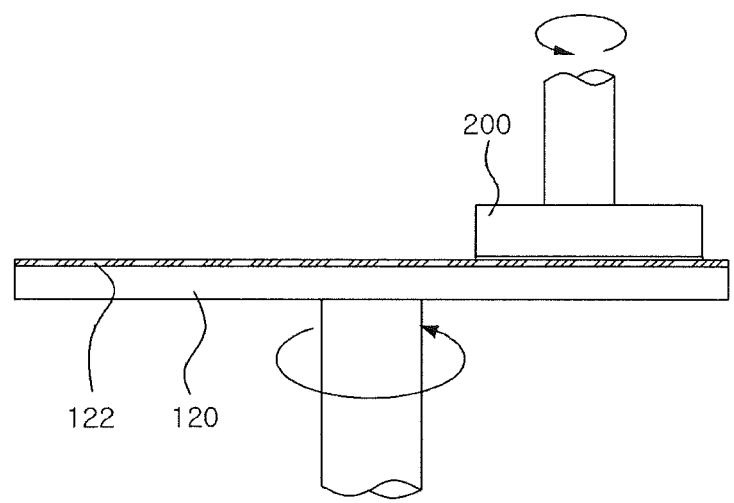
FIG. 6 is a view illustrating a chemical mechanical polishing apparatus according to an embodiment of the present invention, which is a view for explaining a conditioner.
Figure 7:
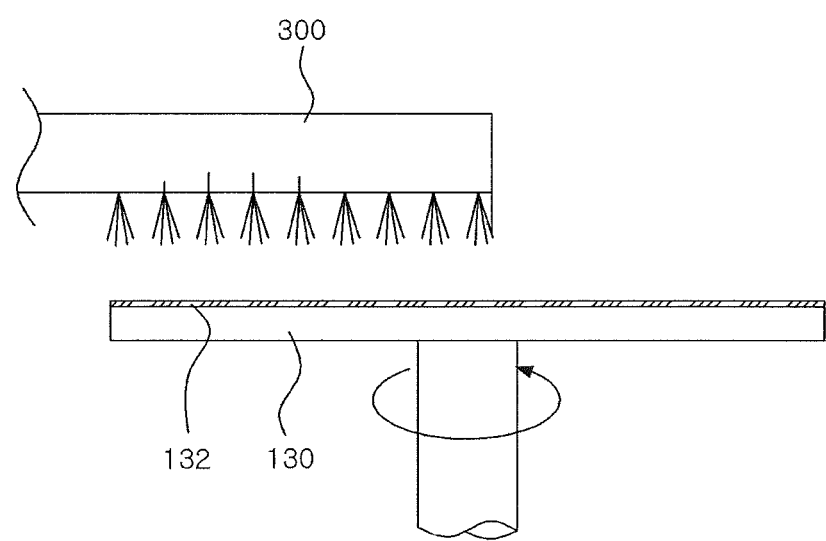
FIG. 7 is a view illustrating a chemical mechanical polishing apparatus according to an embodiment of the present invention, which is a view for explaining a cleaning unit.
Figure 8:
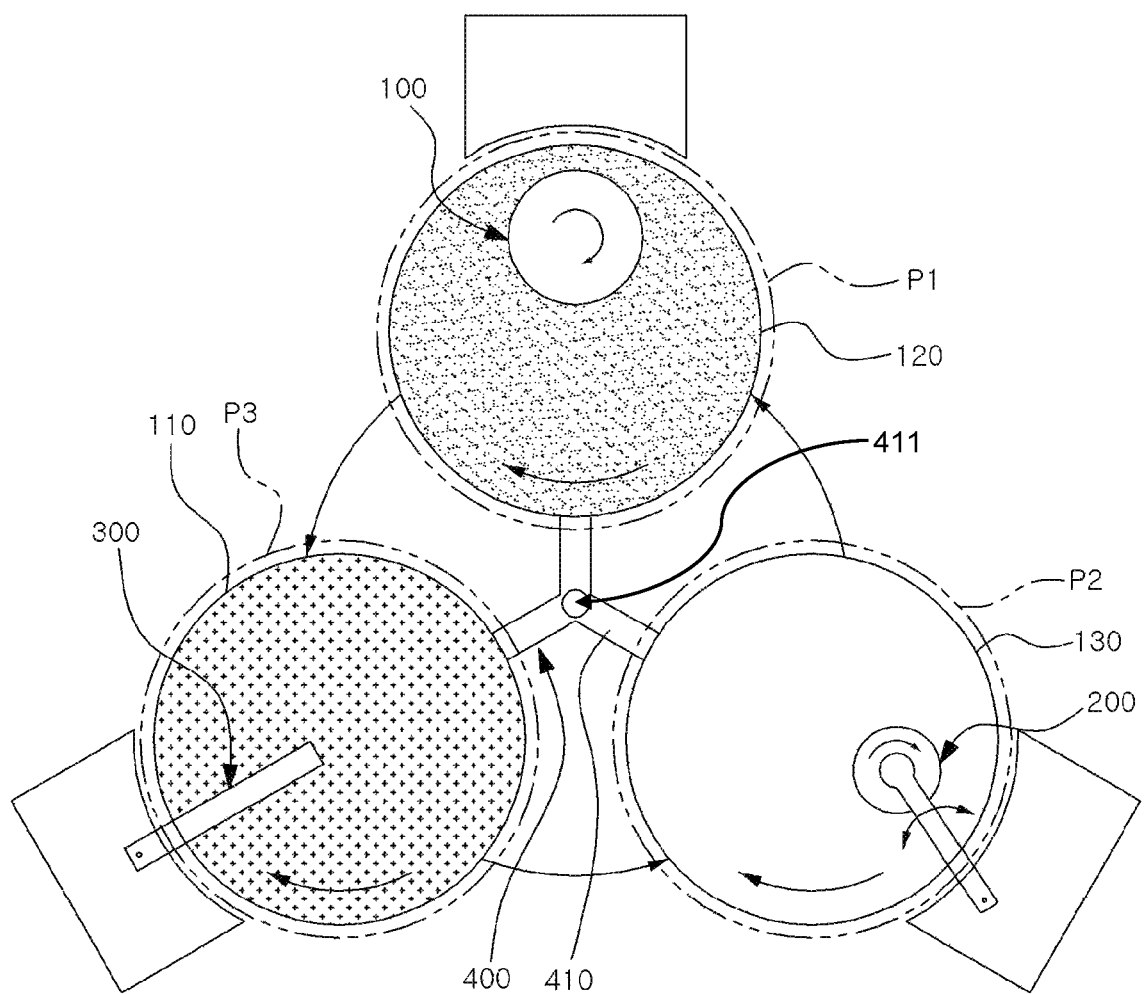
FIGS. 8 and 9 are views illustrating an operating structure of a chemical mechanical polishing apparatus according to an embodiment of the present invention.
Figure 9:
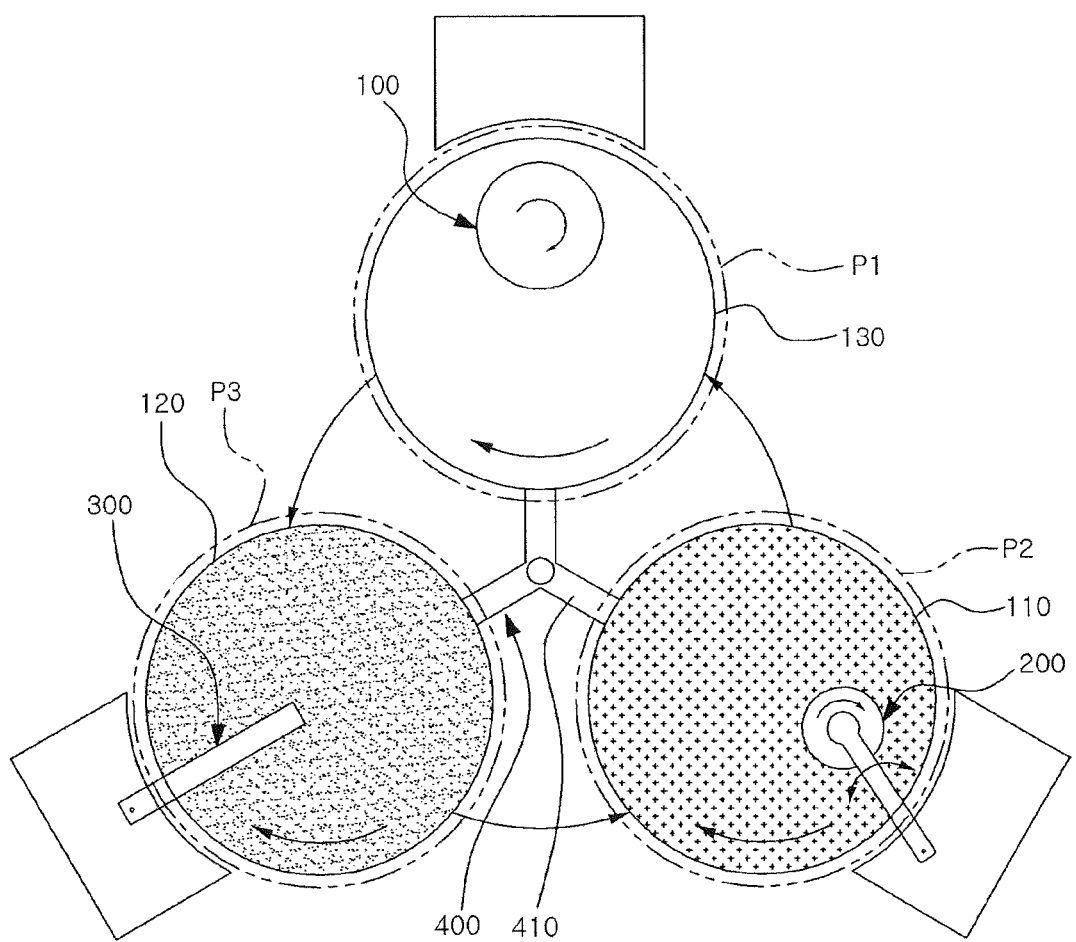

FIGS. 3 and 4 are views illustrating a chemical mechanical polishing apparatus according to an embodiment of the present invention. FIG. 5 is a view illustrating a chemical mechanical polishing apparatus according to an embodiment of the present invention, which is a view for explaining a carrier head. FIG. 6 is a view illustrating a chemical mechanical polishing apparatus according to an embodiment of the present invention, which is a view for explaining a conditioner. FIG. 7 is a view illustrating a chemical mechanical polishing apparatus according to an embodiment of the present invention, which is a view for explaining a cleaning unit. Also, FIGS. 8 and 9 are views illustrating an operating structure of a chemical mechanical polishing apparatus according to an embodiment of the present invention.

Referring to FIGS. 3 to 6, a chemical mechanical polishing apparatus according to an embodiment of the present invention includes polishing platens 110, 120 and 130 and a polishing platen transferring unit 400.

A plurality of polishing platens 110, 120 and 130 may be provided, and the number and position of the polishing platens 110, 120 and 130 may be variously changed according to required conditions and design specifications. Hereinafter, three polishing platens 110, 120 and 130 are configured to be moved to different process positions by the polishing platen transferring unit 400 to be described later.

For reference, a substrate 101 in the present disclosure may be understood as a polishing subject that can be polished on polishing pads 112, 122 and 132, and the present invention is not limited by the type and characteristics of the substrate 101. As an example, a wafer may be used as the substrate 101.

The polishing platens 110, 120 and 130 are individually provided rotatably by a typical driving source, and a polishing pad of a circular disc shape is provided on the upper surfaces of the polishing platens 110, 120 and 130. More specifically, the polishing platen may include a first polishing platen 110, a second polishing platen 120, and a third polishing platen 130 which are rotatably provided independently of each other, and the polishing pads 112, 122 and 132 may include a first polishing pad 112 disposed on the upper surface of the first polishing platen 110, a second polishing pad 122 disposed on the upper surface of the second polishing platen 120, and a third polishing pad 132 disposed on the upper surface of the three polishing platen 130.

The polishing platen transferring unit 400 is provided to move the plurality of polishing platens 110, 120 and 130 to different process positions according to a predetermined process sequence.

The polishing platen transferring unit 400 may transfer each polishing platen by defining different process positions in various conditions according to required conditions and design specifications. For example, the polishing platen transferring unit 400 allows the plurality of polishing platens 110, 120 and 130 to move from a predetermined reference process position P1 to at least one peripheral process position, and different processes may be performed on the polish pad at the reference process position and the peripheral process position. Hereinafter, an example in which a plurality of polishing platens are configured to be moved from the reference process position P1 to a first peripheral process position P2 and a second peripheral process position P3 by the polishing platen transferring unit 400 will be described. In an embodiment, three or more peripheral process positions may be defined, or only one peripheral process position may be defined, and the present invention is not limited by the number of peripheral process positions.

The types and characteristics of processes performed at the reference process position P1 and the peripheral process positions P2 and P3 may be variously changed according to required conditions and design specifications. For example, at the reference process position P1, a substrate may be in contact with the polishing pad 112, 122 or 132, and a chemical mechanical polishing process may be performed. Also, a surface modification process of the polishing pads 112, 122 and 132 may be performed at the first peripheral process position P2, and a cleaning process for cleaning the surfaces of the polishing pads 112, 122 and 132 may be performed at the second peripheral process position P3. In an embodiment, the modification process and the cleaning process may be together performed at the first peripheral process position P2, or the modification process and the cleaning process may be together performed at the second peripheral process position P3. Alternatively, the modification process or the cleaning process may be performed at the reference process position P1.

To this end, a carrier head 100 for pressing a substrate (see 101 of FIG. 5) against the polishing pad (one of the first to third polishing pads) 112, 122 or 132 disposed over the reference process position P1 may be provided at the reference process position P1. Also, a conditioner 200 for surface modification of the polishing pad (one of the first to third polishing pads) 112, 122, or 132 disposed over the first peripheral process position P2 may be provided at the first peripheral process position P2. In addition, a cleaning unit 300 for cleaning the surface of the polishing pad (one of the first to third polishing pads) 112, 122 or 132 disposed over the second peripheral process position P3 may be provided at the second peripheral process position P3.

Referring to FIG. 5, the carrier head 100 may perform a chemical mechanical polishing process by pressing a substrate onto the upper surface of the polishing pads 112, 122 and 132 while slurry (CMP slurry) is being supplied to the upper surfaces of the polishing pads 112, 122 and 132.

The carrier head 100 may be provided in various structures according to required conditions and design specifications. For example, the carrier head 100 may include a body part (not shown) rotatably provided, a base part (not shown) provided so as to be rotatable together with the body part, and an elastic membrane (not shown) provided on the undersurface of the base part.

The elastic membrane may have an opening formed at a central portion thereof, and an inner end adjacent to the central portion of the elastic membrane may be fixed to the base part. An outer end of the elastic membrane may be fixed to the base part by a retainer ring coupled to an edge of the base part.

The elastic membrane may be provided in various structures according to required conditions and design specifications. For example, a plurality of flips (e.g., a ring-shaped flip) may be formed in the elastic membrane, and due to the plurality of flips, a plurality of pressure chambers that are divided along the radial direction of the base part may be provided between the base part and the elastic membrane.

A pressure sensor for measuring pressure may be provided in each of the pressure chambers between the base part and the elastic membrane. The pressure of each of the pressure chambers may be individually adjusted by the control of a pressure chamber controller, and a pressure at which the substrate is pressed may be individually adjusted by controlling the pressure of each pressure chamber. Also, a central pressure chamber (not shown) penetrated by the opening of the elastic membrane may be formed in the central portion of the carrier head 100. The central pressure chamber may communicate directly with a substrate to pressurize a wafer during the polishing process, and may adhere a substrate closely to the elastic membrane of the carrier head 100 with a suction pressure, thereby serving to move the substrate to a third position (e.g., a cleaning device) while holding the substrate.

Also, a slurry supply unit (not shown) for supplying a slurry (CMP slurry) to the surface of the polishing pad may be provided adjacently to the carrier head 100, and the types and characteristics of the slurry supply unit are not limited in the present invention. The slurry supply unit may be provided in a structure integrally connected to the carrier head, or may be provided in a separate structure.

Referring to FIG. 6, the conditioner 200 finely cuts the surface of the polishing pad such that a large number of foam micropores serving to contain a slurry in which an abrasive and chemical substances are mixed are not blocked on the surface of the polishing pad, thereby allowing slurry filled in the foam pores of the polishing pad to be smoothly supplied to the substrate held by the carrier head 100.

As the conditioner 200, a typical conditioner 200 may be used. The type and characteristics of the conditioner 200 may be variously changed according to required conditions and design specifications. For example, the conditioner 200 may hold a conditioning disc (not shown) making contact with the polishing pad during the conditioning process, and may be embedded with a motor and a gear box inside the housing so as to rotate a shaft (not shown) of the conditioning disc. Also, in order to downwardly press the conditioning disc located at the end of an arm (not shown) pivoting about the shaft, a pressing unit (not shown) such as a cylinder downwardly pressurizing by air pressure is installed inside the housing. In addition, due to a sweeping movement of the arm extending from the center of rotation to the housing, microcutting of the foam pores may be performed over a large area of the polishing pad. In an embodiment, the conditioning disc may include diamond particles adhering to a surface in contact with the polishing pad for microcutting of the polishing pad.

Referring to FIG. 7, the cleaning unit 300 is provided to clean foreign substances such as abrasive particles and contaminated slurry remaining on the upper surfaces of the polishing pads 112, 122 and 132 after the chemical mechanical polishing process is completed.

The present invention is not limited to the cleaning structure and method of the cleaning unit 300. For example, the cleaning unit 300 may be configured to clean the surfaces of the polishing pads 112, 122 and 132 by spraying fluid onto the surfaces of the polishing pads 112, 122 and 132.

For reference, the types and characteristics of fluids sprayed from the cleaning unit 300 may be variously changed according to required conditions and design specifications, and the present invention is not limited by the types and characteristics of fluids. For example, the fluid may include any one of cleaning liquid, pure water, steam, nitrogen gas, and dry air. Hereinafter, pure water (DIW), which is one kind of cleaning liquid, will be described as being used as an example. In an embodiment, different kinds of fluids may be simultaneously sprayed from the cleaning unit 300.

Also, different processes may be performed at the reference process position P1 and the peripheral process positions P2 and P3, respectively. At the reference process position P1 and the peripheral process positions P2 and P3, different processes may be simultaneously performed on each polishing pad. For example, while the chemical mechanical polishing process is being performed on the first polishing pad 112 disposed at the reference process position P1, the surface modification process may be performed on the second polishing pad 122 disposed at the first peripheral process position P2, and at the same time, the surface cleaning process may be performed on the third polishing pad 132 disposed at the second peripheral process position P3. In an embodiment, different processes may be performed with a certain time difference on the polishing pads at the reference process position and the peripheral process position, respectively.

The polishing platen transferring unit 400 may move the plurality of polishing platens 110, 120 and 130 to different process positions in various ways according to required conditions and design specifications. For example, the polishing platen transferring unit 400 may rotate the plurality of polishing platens 110, 120 and 130 to different process positions.

Here, when the plurality of polishing platens 110, 120 and 130 are rotated to different process positions, it may be understood that the plurality of polishing platens 110, 120 and 130 circulate to different process positions according to a predetermined process sequence. For example, the plurality of polishing platens 110, 120 and 130 may be disposed on the same circumference, and the polishing platen transferring unit 400 may rotate and move the plurality of polishing platens 110, 120 and 130 to different process positions.

The polishing platen transferring unit 400 may be provided with various structures capable of rotating the plurality of polishing platens 110, 120 and 130. For example, the polishing platen transferring unit 400 may include a connecting member 410 having a plurality of arms 412, 413 and 414 respectively connected to the plurality of polishing platens 110, 120 and 130, and a driving unit 420 providing a driving force through a unit center 411 for rotating the connecting member 410 about the unit center 411. The unit center 411 is a common joint of the plurality of arms 412, 413 and 414 of the connecting member 410.

The connecting member 410 may be rotated about the unit center 411 by a single main shaft 700. As the connecting member 410 rotates about the unit center 411, the plurality of polishing platens 110, 120 and 130 may be rotated to different process positions. As each of the polishing platens 110, 120 and 130 is rotated, the polishing pads 112, 122 and 132 disposed on each of polishing platens 110, 120 and 130 may be rotated and moved to different process positions (e.g., reference process position, first peripheral process position, and second peripheral process position).

The driving unit 420 may include a typical motor, and the driving force of the motor may be transmitted to the connecting member 410 via the unit center 411 by a power transmitting member such as a normal gear or belt.

A sensing unit 500 for sensing the rotational position of the plurality of polishing platens 110, 120 and 130 may be provided. According to the sensing result of the sensing unit 500, the driving unit 420 may be controlled by a controller 600. As the sensing unit 500, a typical sensor capable of sensing the positions of the polishing platens 110, 120 and 130 may be used, and the present invention is not limited by the types and characteristics of the sensing unit 500.

As shown in FIG. 3, a substrate may make contact with the first polishing pad 112 disposed at the reference process position P1 by the carrier head 100, and the chemical mechanical polishing process may be performed. The surface modification process may be performed on the second polishing pad 122 disposed at the peripheral process position P2 by the conditioner 200, and the cleaning process may be performed on the third polishing pad 132 disposed at the second peripheral process position P3 by the cleaning unit 300.

Next, after each first process is completed at the reference process position P1, the first peripheral process position P2, and the second peripheral process position P3, as the respective polishing platens 110, 120 and 130 are rotated by the above-mentioned connecting member 410, the second polishing pad 122 may move from the first peripheral process position P2 to the reference process position P1, the third polishing pad 132 may move from the second peripheral process position P3 to the first peripheral process position P2, and the first polishing pad 112 may move from the reference process position P1 to the second peripheral process position P3 as shown in FIG. 8. Thereafter, the second polishing pad 122 disposed at the reference process position P1 may make contact with a substrate by the carrier head 100 and the chemical mechanical polishing process may be again performed. Also, the surface modification process may be performed on the third polishing pad 132 disposed at the first peripheral process position P2 by the conditioner 200, and the cleaning process may be performed on the first polishing pad 112 disposed at the second peripheral process position P3 by the cleaning unit 300.

In the same manner, after each second process is completed at the reference process position P1, the first peripheral process position P2, and the second peripheral process position P3, as the respective polishing platens 110, 120 and 130 are rotated by the above-mentioned connecting member 410, the third polishing pad 132 may move from the first peripheral process position P2 to the reference process position P1, the first polishing pad 112 may move from the second peripheral process position P3 to the first peripheral process position P2, and the second polishing pad 122 may move from the reference process position P1 to the second peripheral process position P3 as shown in FIG. 9. Thereafter, the third polishing pad 132 disposed at the reference process position P1 may make contact with a substrate by the carrier head 100 and the chemical mechanical polishing process may be again performed. Also, the surface modification process may be performed on the first polishing pad 112 disposed at the first peripheral process position P2 by the conditioner 200, and the cleaning process may be performed on the second polishing pad 122 disposed at the second peripheral process position P3 by the cleaning unit 300.

Thus, as the first polishing platen 110 to the third polishing platen 130 are rotated, the first polishing pad 112 to the third polishing pad 132 are sequentially rotated and moved to the reference process position P1, the first peripheral process position P2, and the second peripheral process position P3. The substrate polished at the reference process position P1 may be transferred to the next process, and another substrate may be seated on the polishing pad moved to the reference process position P1 after the surface modification is completed at the first peripheral process position P2.

[Mode for Invention]

Figure 10:
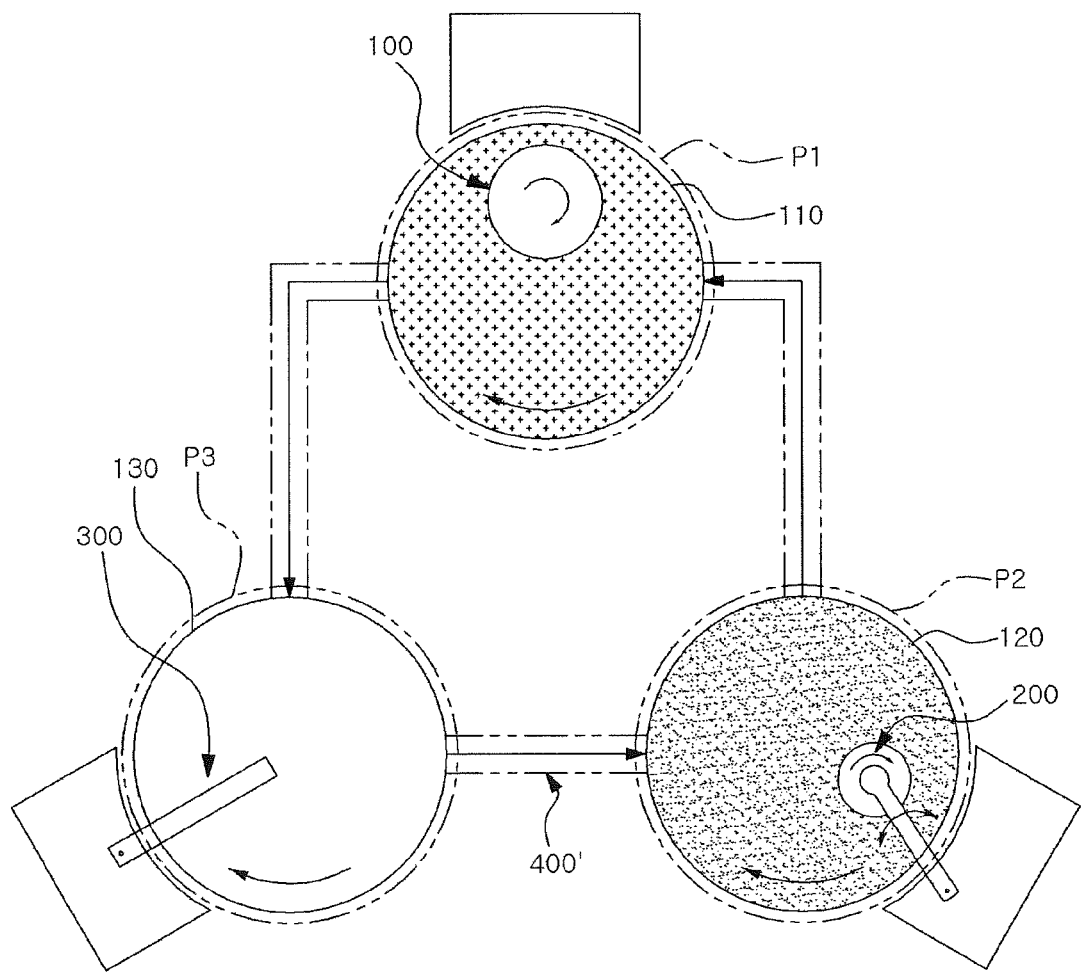
FIGS. 10 to 12 are views illustrating a chemical mechanical polishing apparatus according to another embodiment of the present invention.
Figure 11:
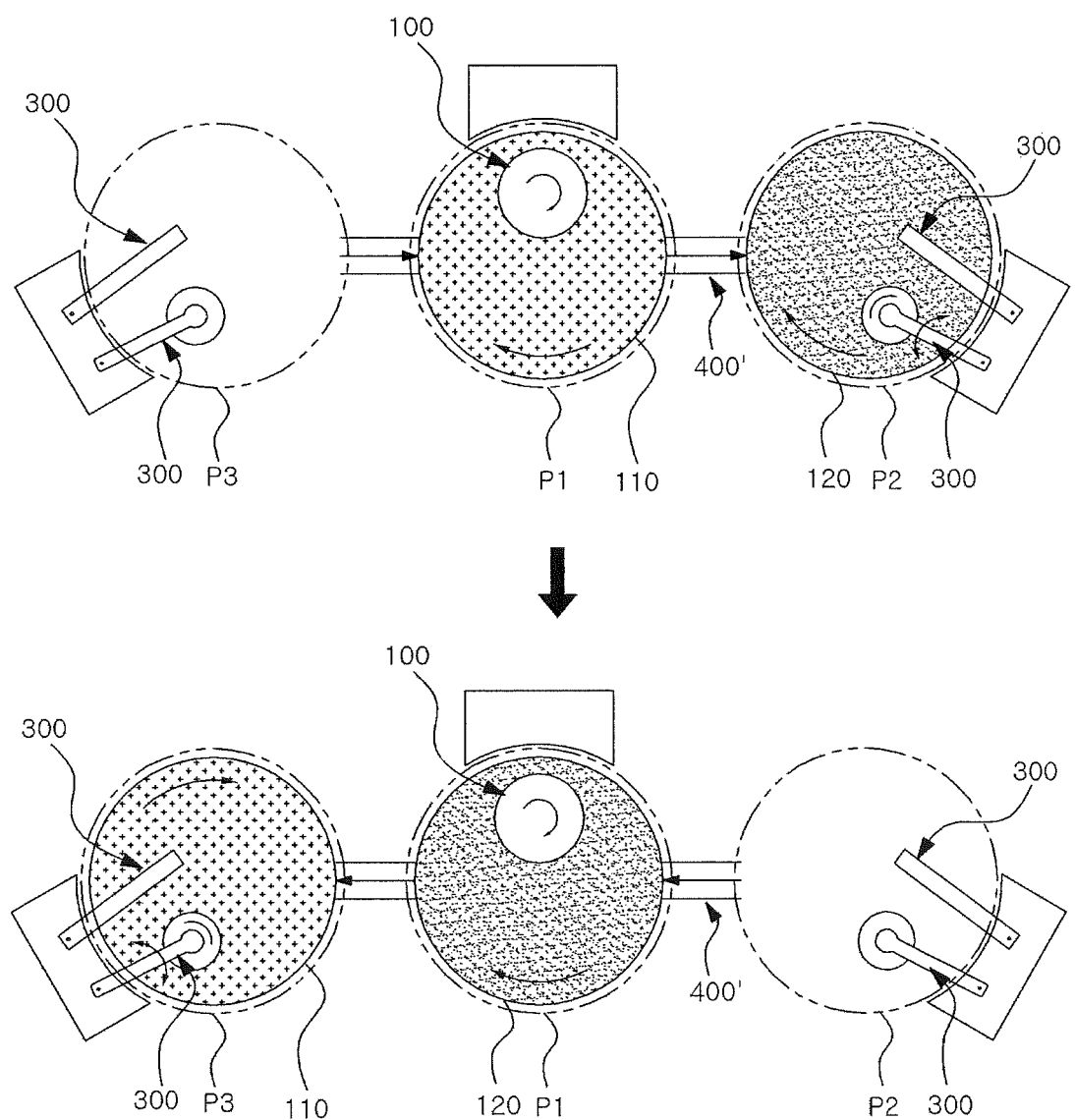
Figure 12:
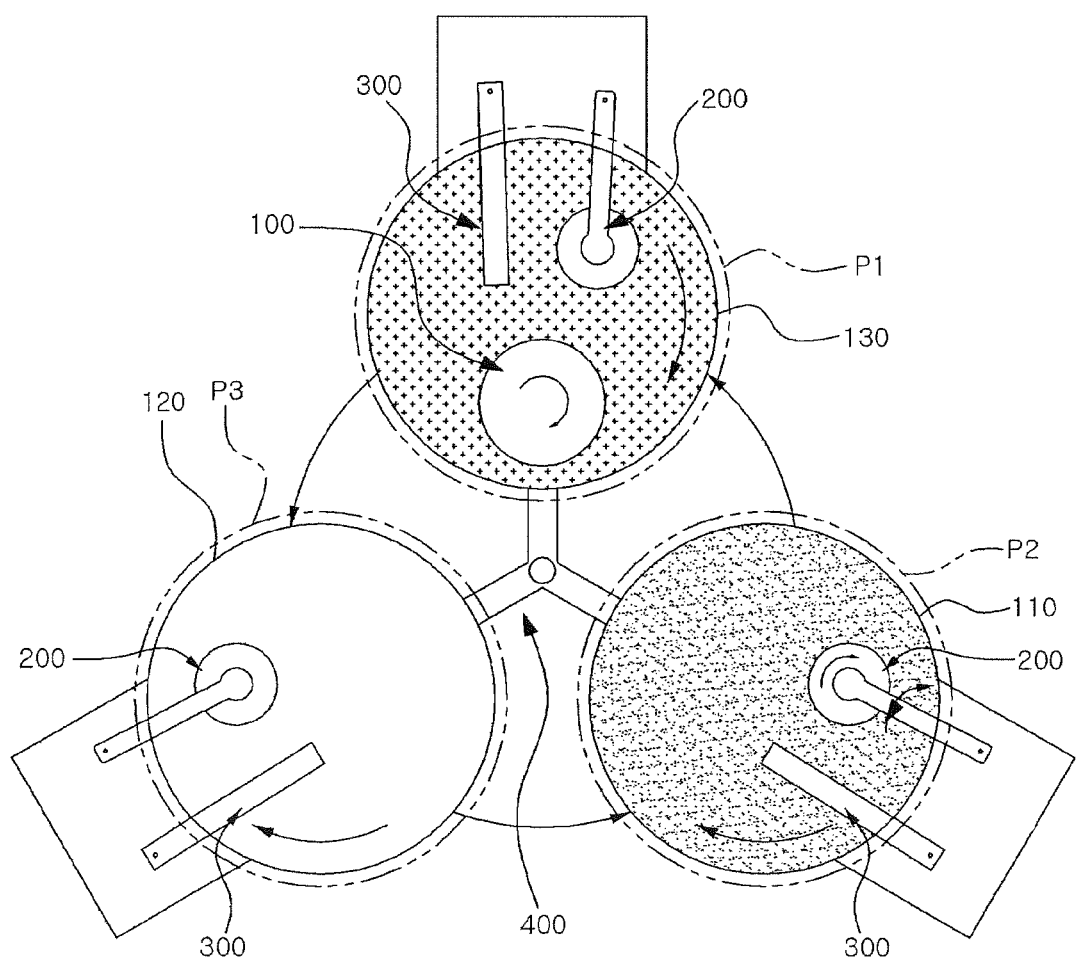

FIGS. 10 to 12 are views illustrating a chemical mechanical polishing apparatus according to another embodiment of the present invention. Also, the same or equivalent components as those of the above-described configuration are denoted by the same or equivalent reference numerals, and a detailed description thereof will be omitted.

Referring to FIG. 10, a chemical mechanical polishing apparatus according to another embodiment of the present invention includes a plurality of polishing platens and a polishing platen transferring unit 400', and the polishing platen transferring unit 400' may rotate a plurality of polishing platens 110, 120 and 130 to different process positions by moving the plurality of polishing platens 110, 120 and 130 in a straight line along a predetermined path.

The polishing platen transferring unit 400' may straightly move the plurality of polishing platens 110, 120 and 130 using a typical rail or guide member. Hereinafter, the polishing platen transferring unit 400' configured to straightly move the plurality of polishing platens 110, 120 and 130 along a rotation path having a substantially rectangular shape and rotate the plurality of polishing platens 110, 120 and 130 to different process positions will be described as an example. In an embodiment, the polishing platen transferring unit may rotate the plurality of polishing platens to different process positions along a path in which straight lines and curved lines are combined, and the present invention is not limited according to the rotation path.

Referring to FIG. 11, a chemical mechanical polishing apparatus according to another embodiment of the present invention includes a plurality of polishing platens and a polishing platen transferring unit 400', and the polishing platen transferring unit 400' may be configured to allow a plurality of polishing platens 110, 120 and 130 to reciprocate to different position.

In an embodiment, at the reference process position P1, a substrate contacts polishing pads 112, 122 and 132, and a chemical mechanical polishing process may be performed. At the first peripheral process position P2 and the second peripheral process position P3, a surface modification process of the polishing pads 112, 122 and 132 and/or a cleaning process of cleaning the surface of the polishing pads 112, 122 and 132 may be performed. The first polishing pad 112 of the first polishing platen 110 may reciprocate between the second peripheral process position P3 and the reference process position P1 by the table transferring part 400', and the second polishing pad 122 of the second polishing platen 120 may reciprocate between the reference process position P1 and the first peripheral process position P2 by the table transferring part 400'.

In an embodiment, the polishing platen transferring unit 400' may allow the first polishing platen 110 and the second polishing platen 120 to straightly reciprocate. In an embodiment, it is also possible for the polishing platen transferring unit to allowing the first and second polishing platens to reciprocate along a rotational or curved path.

For reference, although it is described in FIG. 11 that both of the surface modification process and the cleaning process are performed at the first peripheral process position P2 and the second peripheral process position P3, only one of the surface modification process and the cleaning process may be performed at the first peripheral process position and the second peripheral process position.

Referring to FIG. 12, a chemical mechanical polishing apparatus according to another embodiment of the present invention includes a plurality of polishing platens and a polishing platen transferring unit 400. Here, a conditioner 200 for modifying the surfaces of the first to third polishing pads 112 to 132 may be provided on the first to third polishing platens 110 to 130, and the conditioner 200 may be moved to the reference process position P1, the first peripheral process position P2 and the second peripheral process position P3 together with the first to third polishing pads 110 to 130.

Also, a cleaning unit 300 for cleaning the surfaces of the first to third polishing pads 112 to 132 may be provided over the first to third polishing platens 110 to 130. The cleaning unit 300 may also move to the reference process position P1, the first peripheral process position P2 and the second peripheral process position P3 together with the first to third polishing platens 110 to 130.

Figure 13:
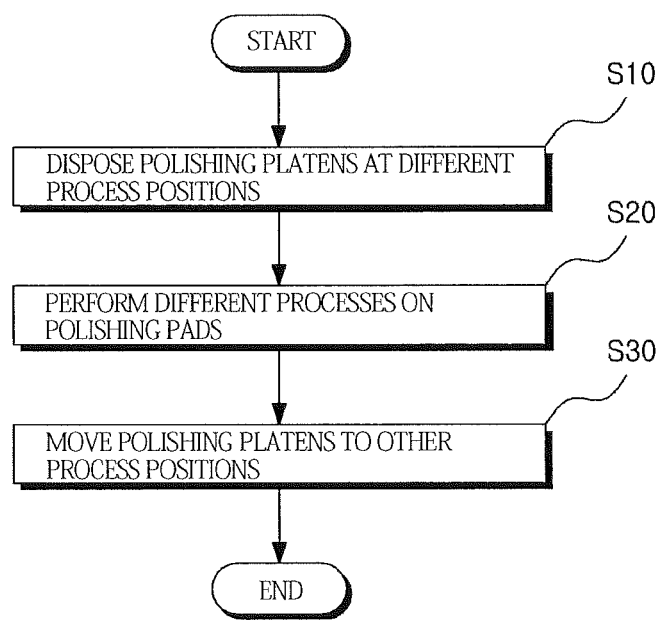
FIG. 13 is a view illustrating a method of controlling a chemical mechanical polishing apparatus according to another embodiment of the present invention.

FIG. 13 is a block diagram illustrating a method of controlling a chemical mechanical polishing apparatus according to another embodiment of the present invention. Also, the same or equivalent components as those of the above-described configuration are denoted by the same or equivalent reference numerals, and a detailed description thereof will be omitted.

Referring to FIG. 13, a method of controlling a chemical mechanical polishing apparatus including a plurality of polishing platens having polishing pads disposed on an upper surface thereof includes disposing the plurality of polishing platens 110, 120 and 130 at different process positions (S10), performing different processes on polishing pads 112, 122 and 132 disposed at the different process positions (S20), and moving the plurality of polishing platens 110, 120 and 130 to different process positions according to a predetermined process sequence (S30).

Operation 1:

First, a plurality of polishing platens 110, 120 and 130 are disposed at different process positions (S10).

In operation S10, the plurality of polishing platens 110, 120 and 130 may be disposed at different process positions.

The different process positions of the plurality of polishing platens 110, 120 and 130 may be defined in various ways according to the required conditions and design specifications. For example, in operation S10, the plurality of polishing platens 110, 120 and 130 may be disposed at a predetermined reference process position P1 and at least one peripheral process position. Hereinafter, it will be illustrated that the plurality of polishing platens 110, 120 and 130 are disposed at the reference process position P1, the first peripheral process position P2, and the second peripheral process position P3.

Operation 2:

Next, different processes are performed on the polishing pads 112, 122 and 132 disposed at the different process positions, respectively (S20).

In operation S20, different processes may be performed on the polishing pads 112, 122 and 132 disposed at different process positions, and the types and characteristics of the processes performed at different process positions are variously changed according to required conditions and design specifications. For example, at the reference process position P1, a substrate may make contact with the polishing pads 112, 122 and 132 and the chemical mechanical polishing process may be performed. Also, the surface modification process of the polishing pads 112, 122 and 132 may be performed at the first peripheral process position P2, and the cleaning process for cleaning the surfaces of the polishing pads 112, 122 and 132 may be performed at the second peripheral process position P3. In an embodiment, the modification process and the cleaning process may be together performed at the first peripheral process position, or the modification process and the cleaning process may be together performed at the second peripheral process position. Alternatively, the modification process or the cleaning process may be performed at the reference process position.

To this end, a carrier head 100 for pressing a substrate onto a polishing pad (one of the first polishing pad to the third polishing pad) disposed over the reference process position P1 may be provided at the reference process position P1. Also, a conditioner 200 for surface modification of a polishing pad (one of the first polishing pad to the third polishing pad) disposed over the first peripheral process position P2 may be provided at the first peripheral process position P2, and a cleaning unit 300 for cleaning the surface of a polishing pad (one of the first polishing pad to the third polishing pad) disposed over the second peripheral process position P3 may be provided at the second peripheral process position P3.

In operation S20, different processes may be performed at the reference process position P1 and the peripheral process positions P2 and P3, respectively. At the reference process position P1 and the peripheral process positions P2 and P3, different processes may be simultaneously performed on each of the polishing pads 112, 122 and 132. For example, while the chemical mechanical polishing process is being performed on the first polishing pad 112 disposed at the reference process position P1, the surface modification process may be performed on the second polishing pad 122 disposed at the first peripheral process position P2, and at the same time, the surface cleaning process may be performed on the third polishing pad 132 disposed at the second peripheral process position P3. In an embodiment, different processes may be performed with a certain time difference on the polishing pads at the reference process position and the peripheral process position, respectively.

Operation 3:

Next, the plurality of polishing platens 110, 120 and 130 are moved to different process positions according to a predetermined process sequence (S30).

In operation S30, the plurality of polishing platens 110, 120 and 130 may be moved to different process positions in various ways according to the required conditions and design specifications.

For example, in operation S30, the plurality of polishing platens 110, 120 and 130 may be rotated and moved to different process positions.

Here, when the plurality of polishing platens 110, 120 and 130 are rotated to different process positions, it may be understood that the plurality of polishing platens 110, 120 and 130 circulate to different process positions according to a predetermined process sequence. For example, the plurality of polishing platens 110, 120 and 130 may be disposed on the same circumference, and the plurality of polishing platens 110, 120 and 130 may be rotated and moved to different process positions in operation S30.

In an embodiment, a substrate may make contact with the first polishing pad 112 disposed at the reference process position P1 by the carrier head 100, and the chemical mechanical polishing process may be performed. The surface modification process may be performed on the second polishing pad 122 disposed at the peripheral process position P2 by the conditioner 200, and the cleaning process may be performed on the third polishing pad 132 disposed at the second peripheral process position P3 by the cleaning unit 300 (see FIG. 3).

Next, after each first process is completed at the reference process position P1, the first peripheral process position P2, and the second peripheral process position P3, as the respective polishing platens 110, 120 and 130 are rotated by the above-mentioned connecting member 410, the second polishing pad 122 may move from the first peripheral process position P2 to the reference process position P1, the third polishing pad 132 may move from the second peripheral process position P3 to the first peripheral process position P2, and the first polishing pad 112 may move from the reference process position P1 to the second peripheral process position P3. Thereafter, the second polishing pad 122 disposed at the reference process position P1 may make contact with a substrate by the carrier head 100 and the chemical mechanical polishing process may be again performed. Also, the surface modification process may be performed on the third polishing pad 132 disposed at the first peripheral process position P2 by the conditioner 200, and the cleaning process may be performed on the first polishing pad 112 disposed at the second peripheral process position P3 by the cleaning unit 300 (see FIG. 8).

In the same manner, after each second process is completed at the reference process position P1, the first peripheral process position P2, and the second peripheral process position P3, as the respective polishing platens 110, 120 and 130 rotate, the third polishing pad 132 may move from the first peripheral process position P2 to the reference process position P1, the first polishing pad 112 may move from the second peripheral process position P3 to the first peripheral process position P2, and the second polishing pad 122 may move from the reference process position P1 to the second peripheral process position P3. Thereafter, the third polishing pad 132 disposed at the reference process position P1 may make contact with a substrate by the carrier head 100 and the chemical mechanical polishing process may be again performed. Also, the surface modification process may be performed on the first polishing pad 112 disposed at the first peripheral process position P2 by the conditioner 200, and the cleaning process may be performed on the second polishing pad 122 disposed at the second peripheral process position P3 by the cleaning unit 300 (see FIG. 9).

In another embodiment, in operation S30, it is possible to straightly move a plurality of polishing platens 110, 120 and 130 along a predetermined path to rotate and move the plurality of polishing platens 110, 120 and 130 to different process positions. Alternatively, it is also possible to configure the plurality of polishing platens to rotate to different process positions along a combined path of a straight line and a curved line in operation S30.

In another embodiment, in operation S30, a plurality of polishing platens 110, 120 and 130 may be configured to reciprocate to different process positions.

In an embodiment, at the reference process position P1, a substrate contacts polishing pads 112, 122 and 132, and a chemical mechanical polishing process may be performed. At the first peripheral process position P2 and the second peripheral process position P3, a surface modification process of the polishing pads 112, 122 and 132 and/or a cleaning process of cleaning the surface of the polishing pads 112, 122 and 132 may be performed. In operation S30, the first polishing pad 112 of the first polishing platen 110 may reciprocate between the second peripheral process position P3 and the reference process position P1, and the second polishing pad 122 of the second polishing platen 120 may reciprocate between the reference process position P1 and the first peripheral process position P2 by the table transferring part 400' (see FIG. 11).

INDUSTRIAL APPLICABILITY

Although exemplary embodiments of the present invention have been described for illustrative purposes, those skilled in the art will understand that various modifications and changes can be made without departing from the scope and spirit of the present invention as disclosed in the accompanying claims.

The invention claimed is:

1. A chemical mechanical polishing apparatus including a first polishing platen provided with a first polishing pad thereon and a second polishing platen provided with a second polishing pad thereon, the apparatus comprising:
   a carrier head configured to perform at least one chemical-mechanical polishing process in a reference process position;
   a conditioner configured to perform at least one surface modification process in a first peripheral process position; and
   a polishing platen transferring unit configured for transferring one of the first polishing platen and the second polishing platen to be disposed at one of the reference process position and the first peripheral process position,
   wherein the apparatus is configured that the conditioner performs a first surface modification process for the second polishing pad in the first peripheral process position, while the carrier head performs a first chemical-mechanical polishing process for a first substrate on the first polishing platen in the reference process position by pressing the first surface against the first polishing pad,
   wherein the apparatus is configured that after the first chemical-mechanical polishing process is completed for the first substrate on the first polishing platen in the reference process position, the polishing platen transferring unit transfers the first polishing platen to the first peripheral process position, the conditioner performs a second surface modification process for the first polishing pad in the first peripheral process position, the polishing platen transferring unit transfers the second polishing platen to the reference process position, and the carrier head performs a second chemical-mechanical polishing process for a second substrate on the second polishing platen in the reference process position by pressing the second substrate against the second polishing pad, and
   wherein the apparatus is configured that the first polishing platen is used for another chemical-mechanical polishing process in the reference process position,
   wherein the polishing platen transferring unit rotates at least one of the first polishing platen and the second polishing platen,
   wherein the polishing platen transferring unit comprises a unit center and a connecting member for connecting the unit center with one of the first, second and third polishing platens at a platen center thereof, a circumference being defined as a boundary of a virtual circle formed by rotation of the connecting member about the unit center,
   at least the first polishing platen and the second polishing platen are disposed on the circumference, and
   the polishing platen transferring unit rotationally moves the first polishing platen and the second polishing platen to one of the reference process position and the first peripheral process position, respectively.

2. The apparatus of claim 1, wherein the apparatus is configured that after the second chemical-mechanical polishing process is completed for the second substrate on the second polishing platen in the reference process position, the polishing platen transferring unit transfers the first polishing platen for which the first surface modification process has been performed in the first peripheral process position to the reference process position.

3. The apparatus of claim 1, wherein the second chemical-mechanical polishing process in the reference process position and the second surface modification process in the first peripheral process position are simultaneously performed.

4. The apparatus of claim 1, wherein the second chemical-mechanical polishing process in the reference process position and the second surface modification process in the first peripheral process position are performed with a predetermined time difference.

5. The apparatus of claim 1, wherein the polishing platen transferring unit comprises:
   a driving unit providing a driving force for rotating the connecting member.

6. The apparatus of claim 5, comprising:
   a sensing unit for sensing a rotation position of the first polishing platen and the second polishing platen.

7. The apparatus of claim 1, wherein the polishing platen transferring unit straightly moves the first polishing platen and the second polishing platen along a predetermined path.

8. A chemical mechanical polishing apparatus including a first polishing platen provided with a first polishing pad thereon, a second polishing platen provided with a second polishing pad thereon and a third polishing platen provided with a third polishing pad thereon, the apparatus comprising:
   a carrier head configured to perform at least one chemical-mechanical polishing process in a reference process position;

a conditioner configured to perform at least one surface modification process in a first peripheral process position;

a cleaning unit configured to perform at least one cleaning process in a second peripheral process position; and a polishing platen transferring unit configured for transferring one of the first, second and third polishing platens to be disposed at one of the reference process position, the first peripheral process position and the second peripheral process position, wherein the apparatus is configured that the conditioner performs a first surface modification process for the second polishing pad in the first peripheral process position, while the carrier head performs a first chemical-mechanical polishing process for a first substrate on the first polishing platen in the reference process position by pressing the first surface against the first polishing pad and the cleaning unit performs a first cleaning process for the third polishing pad on the third polishing platen in the second peripheral process position, wherein the polishing platen transferring unit rotates at least one of the first polishing platen and the second polishing platen, wherein the polishing platen transferring unit comprises a unit center and a connecting member for connecting the unit center with one of the first, second and third polishing platens at a platen center thereof, a circumference being defined as a boundary of a virtual circle formed by rotation of the connecting member about the unit center, at least the first polishing platen and the second polishing platen are disposed on the circumference, and the polishing platen transferring unit rotationally moves the first polishing platen and the second polishing platen to one of the reference process position and the first peripheral process position, respectively.

9. The apparatus of claim 8, wherein the apparatus is configured that after the first chemical-mechanical polishing process is completed for the first substrate on the first polishing platen in the reference process position, the polishing platen transferring unit transfers the first polishing platen to the first peripheral process position for a second surface modification process, the second polishing platen to the second peripheral process position for a second cleaning process and the third polishing platen to the reference process position for a second chemical-mechanical polishing process.

* * * * *